(12) United States Patent
Cho et al.

(10) Patent No.: US 6,690,038 B1
(45) Date of Patent: Feb. 10, 2004

(54) THYRISTOR-BASED DEVICE OVER SUBSTRATE SURFACE

(75) Inventors: Hyun-Jin Cho, Palo Alto, CA (US); Andrew Horch, Mountain View, CA (US); Scott Robins, San Jose, CA (US); Farid Nemati, Menlo Park, CA (US)

(73) Assignee: T-Ram, Inc., San Jose, CA (US)

( * ) Notice: Subject to any disclaimer, the term of this patent is extended or adjusted under 35 U.S.C. 154(b) by 0 days.

(21) Appl. No.: 10/200,987

(22) Filed: Jul. 23, 2002

Related U.S. Application Data

(62) Division of application No. 10/023,052, filed on Dec. 17, 2001, which is a continuation of application No. 09/666,825, filed on Sep. 21, 2000, now Pat. No. 6,448,586, which is a continuation of application No. 09/092,449, filed on Jun. 5, 1999, now Pat. No. 6,229,161.

(51) Int. Cl.[7] .............................................. H01L 29/423
(52) U.S. Cl. ........................ 257/133; 257/147; 257/155; 365/180
(58) Field of Search ................................. 257/133, 147, 257/155; 365/180

(56) References Cited

U.S. PATENT DOCUMENTS

| | | | |
|---|---|---|---|
| 3,918,033 A | 11/1975 | Case et al. | |
| 3,943,549 A | 3/1976 | Jaecklin et al. | |
| 3,986,177 A | 10/1976 | Picquendar et al. | |
| 4,031,412 A | 6/1977 | Ohhinata et al. | |
| 4,032,955 A | 6/1977 | Anthony et al. | |
| 4,090,254 A | 5/1978 | Ho et al. | |
| 4,103,415 A | 8/1978 | Hayes | |

(List continued on next page.)

FOREIGN PATENT DOCUMENTS

| | | |
|---|---|---|
| FR | 2110326 | 6/1972 |
| JP | 57 208177 | 12/1982 |

OTHER PUBLICATIONS

Gribnikov, Z.S., Korobov, V.A., and Mitin, V.V., "The Tunnel Diode As A Thyristor Emitter", Solid–State Electronics, vol. 42, No. 9, pp. 1761–1763, 1998

F.Nemati and J.D. Plummer, *A Novel High Density, Low Voltage SRAM Cell with a Vertical NDR Device*, Center for Integrated Systems, Stanford University, Stanford, CA 94305, Jun. 1998.

F.Nemati and J.D. Plummer, *A Novel Vertical Storage SRAM Cell*, Student Paper written for Center for Integrated Systems, Stanford University, Stanford, CA 94305.

F. Nemati and J.D. Plummer, *A Novel Thyristor–based SRAM Cell (T–RAM) for High–Speed, Low–Voltage, Giga–scale Memories*, Center for Integrated Systems, Stanford University, Stanford, CA, 1999.

Baliga, B.Jayant, *Modern Power Devices*, pp. 349–350, 1987.

Plummer, James D. and Scharf, Brad W., *Insulated–Gate Planar Thyristors: I–Structure and Basic Operation*, pp. 380–386, Feb. 1980.

(List continued on next page.)

*Primary Examiner*—Sara Crane

(57) ABSTRACT

A semiconductor device having a thyristor is arranged in a manner that reduces or eliminates manufacturing difficulties commonly experienced in the formation of such devices, as well as facilitates the implementation of the semiconductor device in a variety of applications. According to an example embodiment of the present invention, a thyristor is formed having some or all of the body of the thyristor extending above a substrate surface of a semiconductor device. The semiconductor device includes at least one transistor having source/drain regions formed in the substrate prior to the formation of the thyristor. One or more layers of material are deposited on the substrate surface and used to form a portion of a body of the thyristor that includes anode and cathode end portions. Each end portion is formed having a base region and an emitter region, and at least one of the end portions includes a portion that is in the substrate and electrically coupled to the transistor. A control port is formed capacitively coupled to at least one of the base regions.

28 Claims, 14 Drawing Sheets

U.S. PATENT DOCUMENTS

| | | | |
|---|---|---|---|
| 4,146,902 A | 3/1979 | Tanimoto et al. |
| 4,165,517 A | 8/1979 | Temple et al. |
| 4,281,336 A | 7/1981 | Sommer et al. |
| 4,323,793 A | 4/1982 | Schutten et al. |
| 4,353,086 A | 10/1982 | Jaccodine et al. |
| 4,590,589 A | 5/1986 | Gerzberg |
| 4,593,459 A | 6/1986 | Poppert et al. |
| 4,612,448 A | 9/1986 | Strack |
| 4,641,166 A | 2/1987 | Takemae et al. |
| 4,646,121 A | 2/1987 | Ogura |
| 4,672,410 A | 6/1987 | Miura et al. |
| 4,673,962 A | 6/1987 | Chatterjee et al. |
| 4,677,455 A | 6/1987 | Okajima |
| 4,734,384 A | 3/1988 | Tsuchiya |
| 4,797,373 A | 1/1989 | Malhi et al. |
| 4,829,357 A | 5/1989 | Kasahara |
| 4,833,516 A | 5/1989 | Hwang et al. |
| 4,864,168 A | 9/1989 | Kasahara et al. |
| 4,868,138 A | 9/1989 | Chan et al. |
| 4,959,703 A | 9/1990 | Ogura et al. |
| 4,982,258 A | 1/1991 | Baliga |
| 4,997,790 A | 3/1991 | Woo et al. |
| 5,034,785 A | 7/1991 | Blanchard |
| 5,081,518 A | 1/1992 | El-Diwany et al. |
| 5,082,796 A | 1/1992 | El-Diwany et al. |
| 5,099,300 A | 3/1992 | Baliga |
| 5,106,776 A | 4/1992 | Shen et al. |
| 5,252,845 A | 10/1993 | Kim et al. |
| 5,307,310 A | 4/1994 | Narita |
| 5,321,285 A | 6/1994 | Lee et al. |
| 5,321,289 A | 6/1994 | Baba et al. |
| 5,324,966 A | 6/1994 | Muraoka et al. |
| 5,334,548 A | 8/1994 | Shen et al. |
| 5,390,145 A | 2/1995 | Nakasha et al. |
| 5,396,454 A | 3/1995 | Nowak |
| 5,412,598 A | 5/1995 | Shulman |
| 5,463,344 A | 10/1995 | Temple |
| 5,464,994 A | 11/1995 | Shinohe et al. |
| 5,471,419 A | 11/1995 | Sankaranarayanan et al. |
| 5,488,242 A | 1/1996 | Sunouchi et al. |
| 5,504,357 A | 4/1996 | Kim et al. |
| 5,525,820 A | 6/1996 | Furuyama |
| 5,528,062 A | 6/1996 | Hsieh et al. |
| 5,543,652 A | 8/1996 | Ikeda et al. |
| 5,587,944 A | 12/1996 | Shen et al. |
| D382,403 S | 8/1997 | Koskinen |
| 5,689,458 A | 11/1997 | Kuriyama |
| 5,874,751 A | 2/1999 | Iwamuro et al. |
| 5,910,738 A | 6/1999 | Shinohe et al. |
| 5,914,503 A | 6/1999 | Iwamuro et al. |
| 5,936,267 A | 8/1999 | Iwamuro |
| 5,939,736 A | 8/1999 | Takahashi |
| 5,981,984 A | 11/1999 | Iwaana et al. |
| 6,081,002 A | 6/2000 | Amerasekera et al. |
| 6,218,217 B1 | 4/2001 | Uenishi et al. |
| 6,225,165 B1 | 5/2001 | Noble et al. |
| 6,229,161 B1 * | 5/2001 | Nemati et al. ............. 257/133 |
| 6,391,689 B1 | 5/2002 | Chen |
| 6,448,586 B1 * | 9/2002 | Nemati et al. ............. 257/133 |
| 6,462,359 B1 | 10/2002 | Nemati et al. |
| 2001/0024841 A1 | 9/2001 | Noble, Jr. et al. |
| 2002/0093030 A1 | 7/2002 | Hsu et al. |
| 2002/0096690 A1 | 7/2002 | Nemati et al. |
| 2002/0100918 A1 | 8/2002 | Hsu et al. |

OTHER PUBLICATIONS

Christopher J. Petti, and James D. Plummer, *The Field–Assisted Turn–Off Thyristor: A Regenerative Device with Voltage–Controlled Turn–Off*, Aug. 1992.

S. M. Sze, *Physics of Semiconductor Devices Second Edition*, John Wiley & Sons, pp. 198–209, 1981.

* cited by examiner

THYRISTOR-BASED DEVICE OVER SUBSTRATE SURFACE

RELATED PATENT DOCUMENTS

This is a divisional of patent application Ser. No. 10/023,052, now U.S. Pat. No. 6,653,174, filed on Dec. 17, 2001, to which Applicant claims priority under 35 U.S.C. §120, which is a continuation of Ser. No. 09/666,825 filed Sep. 21, 2000 U.S. Pat. No. 6,448,586 which is a continuation of Ser. No. 09/092,449 filed Jun. 5, 1999 U.S. Pat. No. 6,229,161.

FIELD OF THE INVENTION

The present invention is directed to semiconductor devices and, more specifically, to semiconductor devices including thyristor-based devices.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner, as well as forming the devices in a variety of arrangements, and in particular for highly-dense applications, has become increasingly important.

An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors, or 6 transistors, which result in much lower density, with typical cell size being between about 60 $F^2$ and 150 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in providing a bi-stable element for such memory cells and in overcoming many previously unresolved problems for thyristor-based memory applications. This type of NDR device has a control port that is capacitively coupled to a relatively-thin thyristor body. The thyristor body is sufficiently thin to permit modulation of the potential of the thyristor body in response to selected signals capacitively coupled thereto via the control port. Such capacitively-coupled signals are used to enhance switching of the thyristor-based device between current-blocking and current-conducting states. However, an important consideration in semiconductor device design, including the design of memory cells employing thin capacitively-coupled thyristors, is forming devices in highly-dense arrays to meet demands for ever-increasing memory volume and speed.

One method to make a thyristor-based NDR device is to form a vertical silicon pillar by first depositing a layer of silicon on a substrate and then subsequently masking and etching the deposited silicon layer, leaving the pillar behind. However this method presents a number of manufacturing issues, including those related to the forming of other structures in and on the substrate, such as planar MOSFET devices, after the thyristor pillar is formed. For example, it is extremely difficult to add STI (Shallow Trench Isolation) after the pillar etch since STI usually requires a chemical-mechanical polishing (CMP) step. Also, patterning used to form a mask, such as for photolithography, is difficult near such a pillar due to resist puddling. Additionally, angled implants used after the formation of the pillar may introduce shadowing problems, resulting in the pillar being implanted instead of the intended implantation of other devices near the thyristor. Implanting the pillar to form the thyristor, as well as masking horizontal devices near the pillar, such as source/drain regions of a MOSFET, is also challenging.

The above-mentioned and other difficulties associated with the formation of vertical thyristor-based devices have and continue to present challenges to the manufacture and implementation of such devices.

SUMMARY

The present invention is directed to a thyristor-based memory cell that addresses the above-mentioned challenges. The present invention is exemplified in a number of implementations and applications, some of which are summarized below.

According to an example embodiment of the present invention, a semiconductor device is manufactured having a thyristor structure that addresses the challenges mentioned hereinabove. The device includes a transistor coupled in series with a thyristor, with the transistor having a gate over the upper surface and source/drain regions in the substrate below the upper surface. A portion of the thyristor extends over the upper surface with one of the source/drain regions also forming an emitter of the thyristor. With this approach, the semiconductor device can be formed in a relatively compact arrangement, which is particularly useful in high-density memory applications. Furthermore, the thyristor can be formed after transistors and/or other circuit elements of the device have been formed, which makes this approach relatively efficient to manufacture.

In a more particular example embodiment of the present invention, a vertically-arranged thin capacitively-coupled thyristor device is formed over a surface of a semiconductor substrate having a source/drain region of a transistor formed therein, and a gate for the transistor formed on the surface. First, an oxide is formed over the substrate surface (e.g., after one or more other devices, such as a gate, have been formed), and an opening is etched in the oxide over a doped region in the substrate. Amorphous polysilicon is deposited in the opening, recrystallized and doped (e.g., by ion implant) to form a first thyristor base region that is adjacent to the doped substrate region, which forms a first emitter region for the thyristor. The polarity of the first thyristor base region is opposite to the polarity of the doped substrate region, with the first base region and the first emitter region forming an end portion (e.g., anode or cathode) of the vertical thin capacitively-coupled thyristor. A second base region is formed on the first base region having a polarity that is opposite to the polarity of the first base region. A second emitter region having a polarity that is opposite to the polarity of the first emitter region is formed on the second base region, with the second emitter and second base regions forming a second end portion (e.g., anode or cathode) of the thin capacitively-coupled thyristor. A portion of the oxide adjacent to the thin capacitively-coupled thyristor is removed and a thin capacitively coupled gate is formed in place of the oxide, adjacent one of the base regions and capacitively coupled to the base region.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which:

FIGS. 1–4 show a thyristor-based semiconductor device at various stages of manufacture, according to an example embodiment of the present invention, in which;

FIG. 1 shows transistors having source/drain regions formed in a substrate and gates over the substrate;

FIG. 2 shows the thyristor-based semiconductor device of FIG. 1 having an oxide layer and vertical pillar formed over the substrate;

FIG. 3 shows the thyristor-based semiconductor device of FIG. 2 having portions of the vertical pillar doped; and FIG. 4 shows the thyristor-based semiconductor device of FIG. 3 having control ports arranged for capacitively coupling to one or more doped portions of the pillar;

Figure 1:
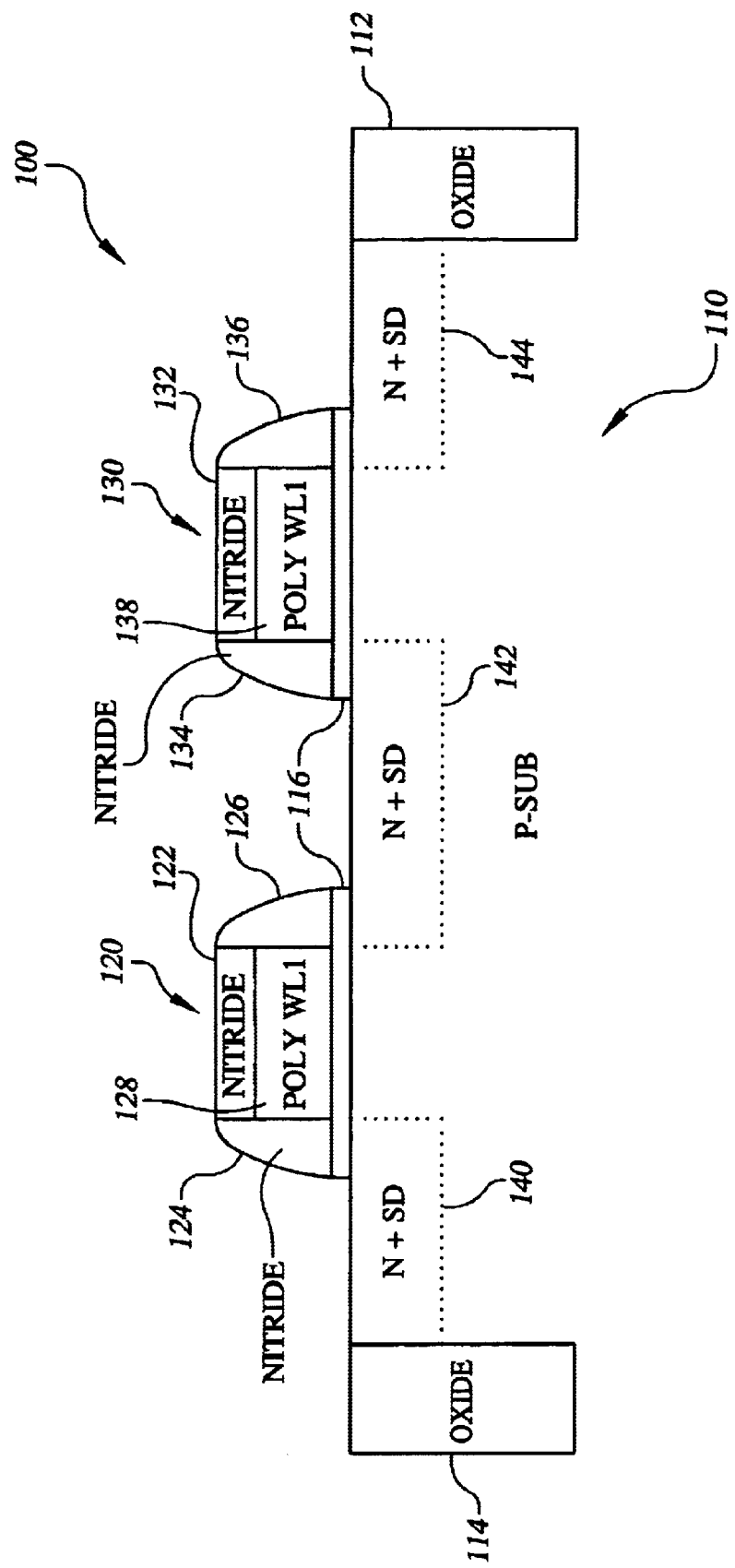

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices and has been found to be particularly suited for devices using thyristor-based devices, such as memory cells, and for enhancing the ability to form such devices over a semiconductor substrate. While the present invention is not necessarily limited to such devices, various aspects of the invention may be appreciated through a discussion of various examples using this context.

According to an example embodiment of the present invention, a thyristor-based semiconductor device, such as a memory cell using a thin capacitively-coupled thyristor, is manufactured in a manner that includes forming a portion of the device extending from a substrate surface. A dielectric material is formed over a substrate having a device therein, such as a logic device, a pass gate, or a transistor having source/drain regions in the substrate and a gate over the substrate. An opening is etched in the dielectric material and material that is to be used to form the thyristor is deposited therein. The deposited material is implanted with a selected dopant to form anode and cathode end portions of the body of the thyristor. A thyristor access port, such as a gate, is then formed capacitively coupled to one of the end portions of the thyristor, and is further coupled to other circuitry in the device. With this approach, challenges including those discussed in the background hereinabove are addressed, including the formation of a thyristor having adequate gate to base coupling while maintaining the ability to manufacture devices near the thyristor.

In a more particular implementation, dielectric material that is to be used between the access port and the body of the thyristor is deposited on a substrate and selectively etched. A semiconductor material is subsequently deposited to fill the selectively etched dielectric material, thereby forming a pillar that is subsequently implanted to form the thyristor body.

In another particular implementation, the thyristor is formed as part of a memory cell that uses either an NMOSFET or a PMOSFET as an access transistor for accessing an emitter region of the thyristor. The thyristor is formed using a source/drain region of the access transistor as an emitter region of the body of the thyristor. A base region is formed adjacent to the source/drain region and used with the source/drain region to form a first end portion of the thyristor. The doping of the base region is selected to correspond with the source/drain region as either an anode or cathode end portion of the thyristor. For example, if the source/drain region is N+ doped, the base region is formed having a P dopant. A second end portion of the thyristor is formed having a base and emitter regions doped to a polarity that is opposite to the polarity of the first end portion and to form either an anode or cathode end portion. The end portions are formed so that one end portion is a cathode and the other end portion is an anode. An access port is formed capacitively coupled to one of the base portions and further coupled to circuitry in the device.

In another example embodiment of the present invention, a hard mask, such as nitride, is formed over a logic gate prior to forming the thyristor over the substrate. The hard mask over the gate is advantageous, for example, for optional use as an etch stop that protects the logic gate from subsequent etch processes. The hard mask can also be used to protect the gate from shorting to the thyristor structure, which makes possible tighter spacing between the gate and the subsequently-formed vertical thyristor device. In a more particular example embodiment of the present invention, a polycide is formed over the gate prior to forming the hard mask.

The present invention is applicable to a variety of devices. On such device includes a type of NDR-based SRAM cell that can potentially provide the speed of conventional SRAM at the density of DRAM in a CMOS compatible process. This SRAM cell uses a thin capacitively-coupled NDR device and more specifically a thin capacitively-coupled thyristor to form a bistable element for the SRAM cell. For more details of specific examples of this device, reference may be made to: "A Novel High Density, Low Voltage SRAM Cell With A Vertical NDR Device," VLSI Technology Technical Digest, June, 1998; "A Novel Thyristor-based SRAM Cell (T-RAM) for High-Speed, Low-Voltage, Giga-Scale Memories," International Electron Device Meeting Technical Digest 1999, "A Semiconductor Capacitively-Coupled NDR Device And Its Applications For High-Speed High-Density Memories And Power Switches," PCT Int'l Publication No. WO 99/63598, corresponding to U.S. patent application No. 09/092,449, now U.S. Pat. No. 6,229,161 B1. Each of these documents is incorporated by reference in its entirety.

In the figures that follow, portions of the devices shown that are similar to those discussed in connection with earlier figures are labeled using reference numbers that are not inconsistent with those used in other ones of the figures. In addition, selected figures show repeated structures for brevity, wherein selected ones of the structures are described with reference numbers with the intent that the reference numbers used may also be applicable to the repeated structures. In this regard, various discussion and labeling of repeated structures are omitted for brevity. Moreover, each of the shown example embodiments may be applicable to, for example, a single implementation of the device and/or an array of such structures to be used in selected applications that include memory cells.

FIGS. 1–4 show a semiconductor device 100 at various stages of manufacture, according to an example embodiment of the present invention. In FIG. 1, insulator 112 and 114, such as an oxide, is formed in a substrate 110 and electrically isolates devices formed therein. The substrate 110 is selectively implanted to form the various wells and doping levels required by any MOSFETs in the process. A gate dielectric material 116 is formed over the substrate, and poly gate materials 128 and 138 are deposited. The poly gate materials are masked, etched and N+ source/drain regions 140, 142 and 144 are implanted into the substrate 110 (various other implants such as LDD or source/drain extensions and/or halo may be done as well). In one implementation, the gate materials include nitride hard masks 122 and 132, and in another implementation the nitride hard masks are added after implantation. After the source/drain regions are created, nitride spacers 124, 126, 134 and 136 are formed on the sidewalls of each gate. The resulting structures include MOSFETs 121 and 131, each having gates 120 and 130 respectively over channels separating source/drain regions 140 and 142, and source/drain regions 142 and 144. In this particular example embodiment, the resulting structure shown in FIG. 1 includes N-MOSFET devices. However, as discussed herein, the present invention is applicable to a variety of semiconductor devices, for example, such as P-MOSFET devices manufactured in a similar manner.

Figure 2:
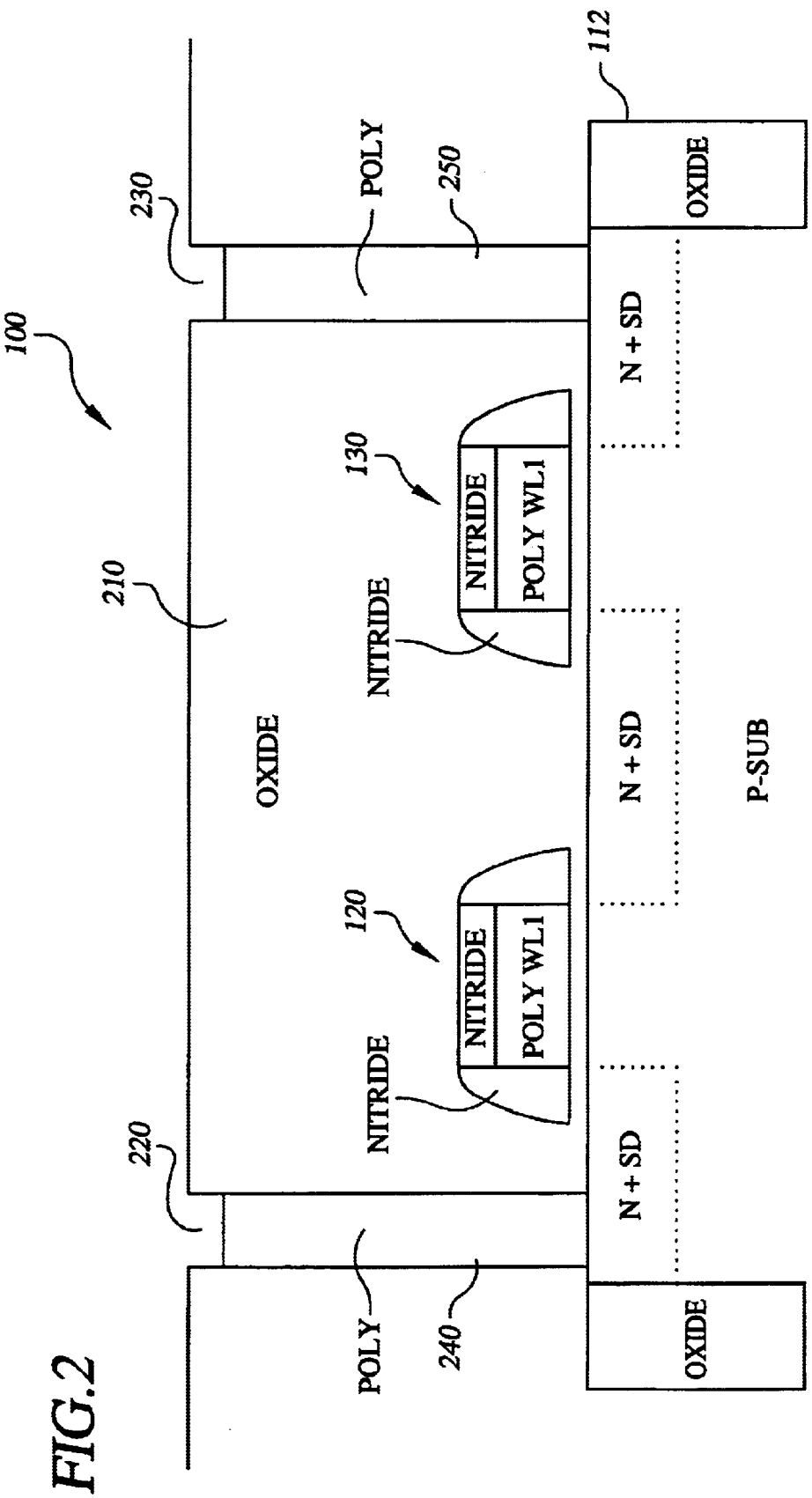
Figure 3:
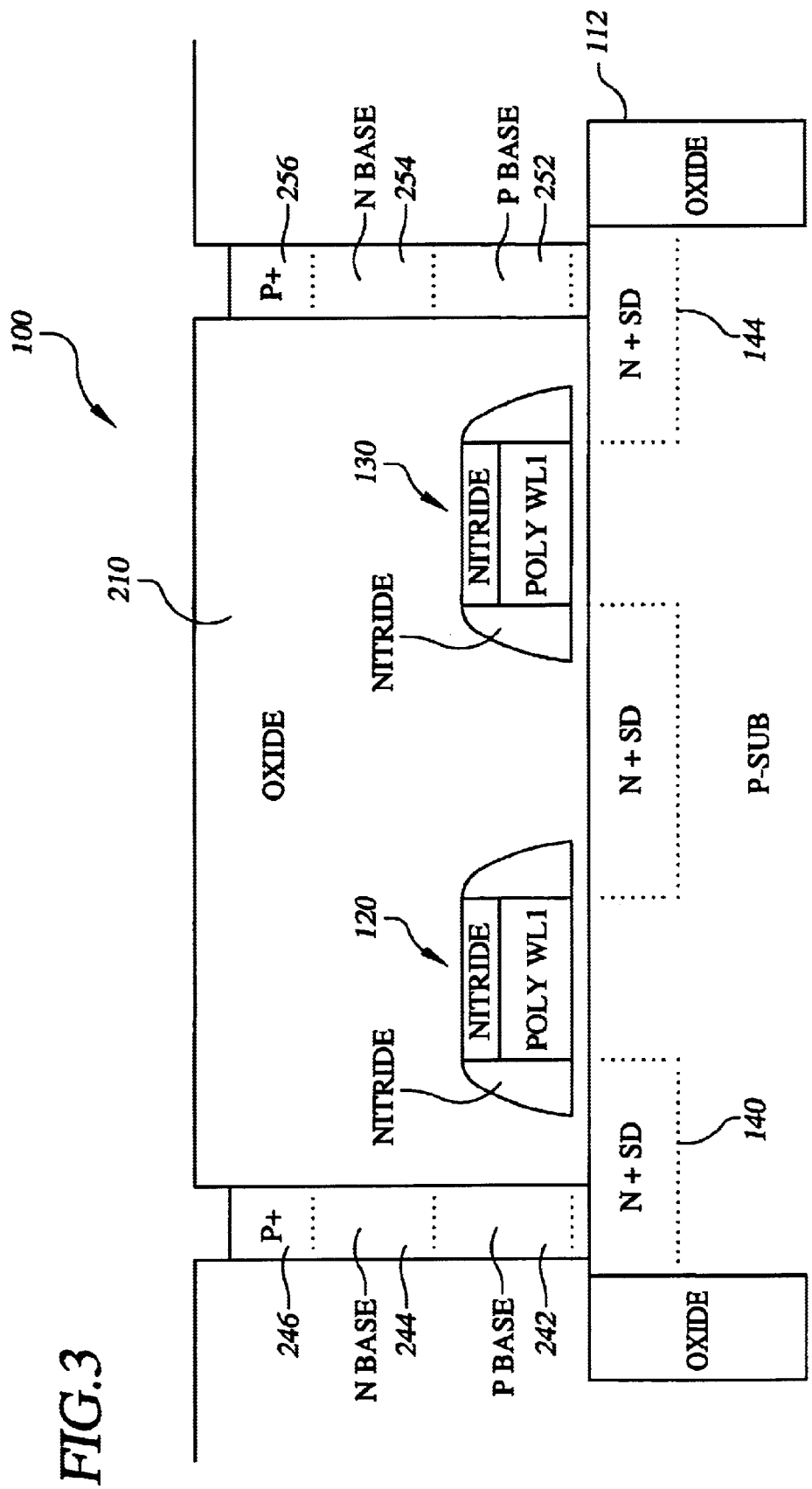

After the gates 120 and 130 are formed, an oxide region 210 is formed over the device as shown in FIG. 2. A portion of the oxide region 210 is removed to form openings 220 and 230, and amorphous polysilicon material 240 and 250 is deposited in the openings, etched back and/or planarized to a top portion of the oxide region 210, forming pillars in the openings 220 and 230. The amorphous polysilicon may, for example, be formed using a single deposition or using multiple film depositions. The amorphous polysilicon can further be recrystallized into single crystal silicon. The pillar material is further doped, as shown in FIG. 3, to form P base regions 242 and 252, N base regions 244 and 254 and P+ regions 246 and 256. The P base, N base and P+ regions, together with the N+ source/drain regions 140 and 144 in the substrate, form the body of the thyristor devices.

In one implementation, the oxide region 210 discussed above in connection with FIG. 2 includes an etch stop layer. For example, the oxide region 210 can be formed by first depositing a thin layer of oxide, followed by a thin layer of nitride over the oxide and a thick layer of oxide over the nitride. With this approach, the nitride can be used as an etch stop in later process steps.

Figure 4:
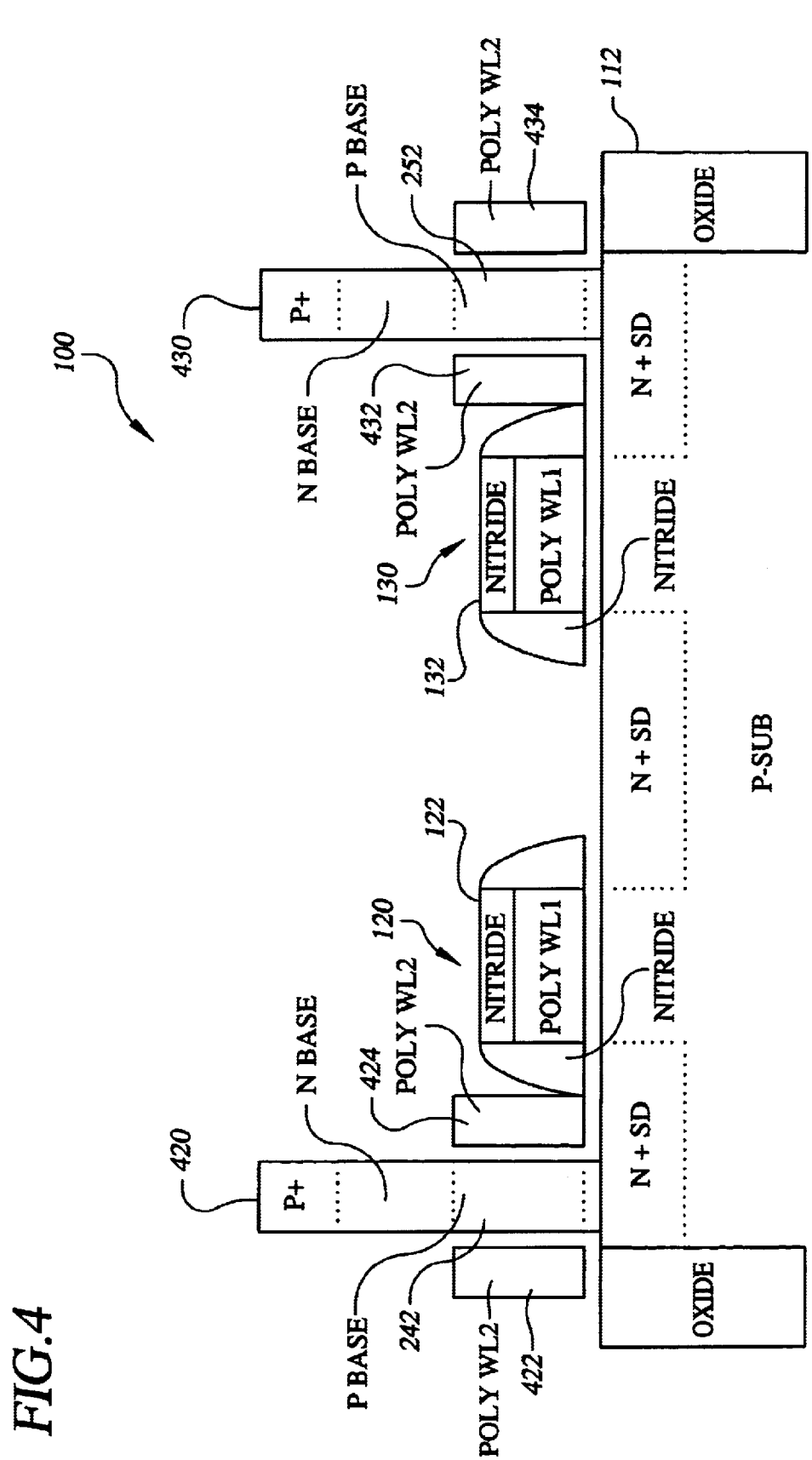

After the body of the thyristor devices are formed in FIG. 3, the oxide 210 is etched to expose the gates 120 and 130 and the thyristor bodies 420 and 430, as shown in FIG. 4. The etching uses the hard masks 122 and 132 as an etch stop over the gates. After the oxide is etched, thyristor control ports 422 and 424 are formed adjacent the P base region 242 of the thyristor 420 and thyristor control ports 432 and 434 are formed adjacent to the P base region 252 of the thyristor 430. The formation of the control ports (for example, as gates) may include a first deposition and/or growth of a dielectric material on the P base followed by a deposition of the control port material. In one implementation, the dielectric material is deposited and a mask is patterned over the deposited dielectric and the thyristor body. The dielectric material is then etched to form a dielectric material having a selected thickness. After the dielectric material is etched, control port material, such as polysilicon, is deposited and subsequently masked and etched in a similar manner to the dielectric material. In one particular implementation, the gate of the transistor is used as a back gate for the vertical thyristor. Once the vertical thyristor devices and control ports are manufactured, the device can be coupled to other circuitry in a multitude of manners to effect various types of operation.

In another example embodiment of the present invention (not shown), the control ports are formed without using a patterning mask as discussed hereinabove. In this implementation, the thyristor control ports are formed by deposition and etch back leaving a spacer of conductive material to form the control port, which is particularly advantageous in that it simplifies the formation process. The pillars in a given word line are formed sufficiently close to one another such that the control port spacers short to each other. In one particular implementation, a dummy (extra) pillar is added to contact the control port spacer. A contact (e.g., to a metal 1 structure or a local interconnect) is brought down around this dummy pillar to contact the control port spacer material.

Figure 5:
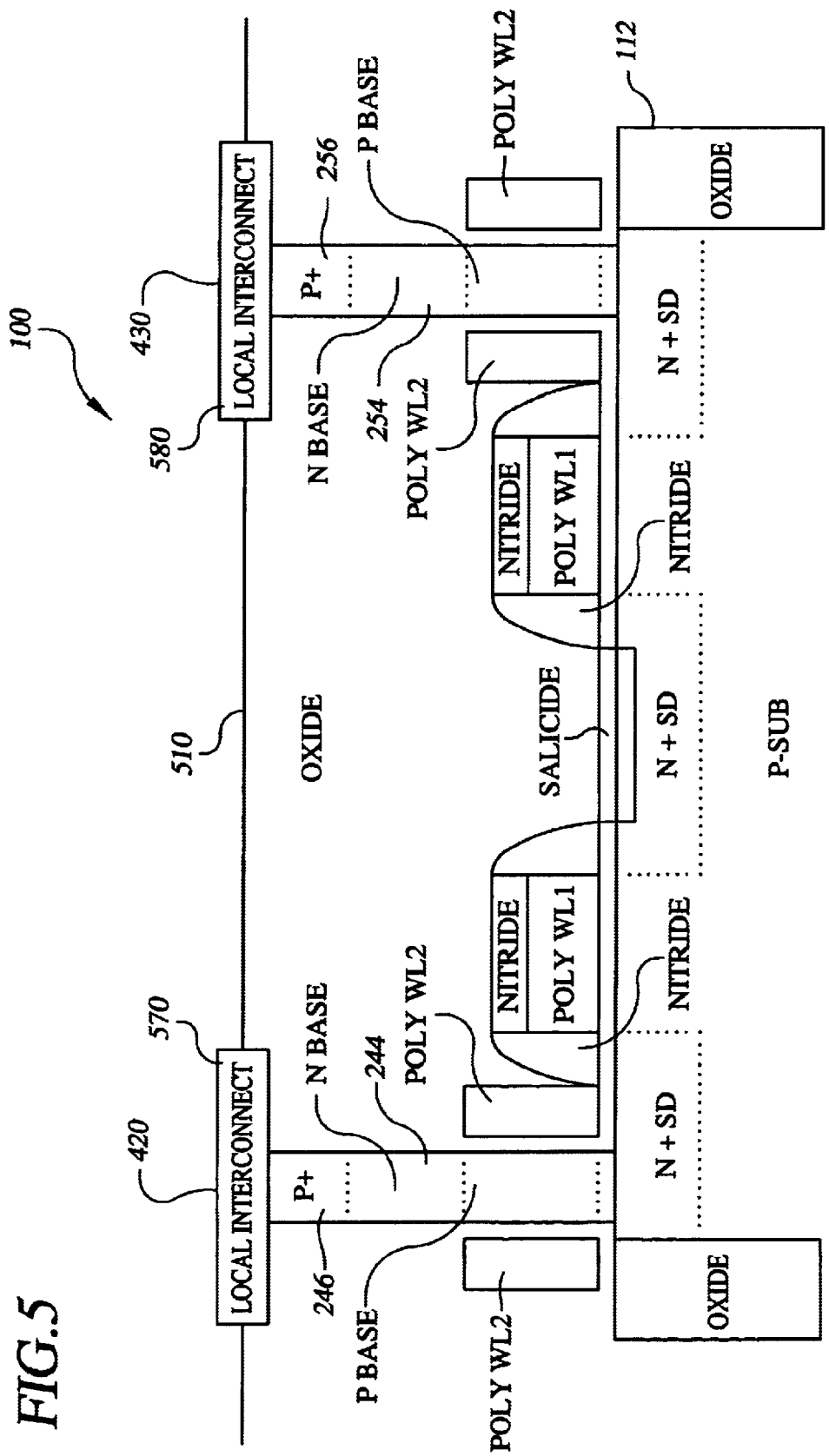
FIG. 5 shows a thyristor-based semiconductor device, such as the device shown in FIG. 4, having thyristors coupled to a local interconnect, according to another example embodiment of the present invention.

In FIG. 5, the semiconductor device shown being manufactured in FIGS. 1–4 is further coupled to a local interconnect, according to another example embodiment of the present invention. An oxide 510 is deposited over the device 100, and local interconnects 570 and 580 are formed coupled to the P+ emitter regions 246 and 256, respectively. The formation of the local interconnects may, for example, include depositing conductive material.

In one particular example embodiment of the present invention, polysilicon is used for the local interconnect and is formed as the emitter region of the body of the thyristor. For example, referring to FIG. 5, the oxide can be etched back to expose the top portion of the N base regions 244 and 254. In this implementation, the P+ regions would not be formed as indicated in connection with the discussion of FIG. 3. Once the top portions of the N base regions are exposed, polysilicon is deposited on the N base regions and doped to form P+ emitter regions of the thyristor and is used as a portion of the local interconnect. This approach has been found to be particularly advantageous via reduction of the chance of over etching and shorting the anode to the N Base region. Furthermore, using polysilicon for both the P+ emitter region and the local interconnect reduces the vertical pillar height of the thyristor devices, which in turn reduces the aspect ratio of the contacts to the control ports of the thyristors, and eliminates the need to separately form the emitter regions.

Figure 6:
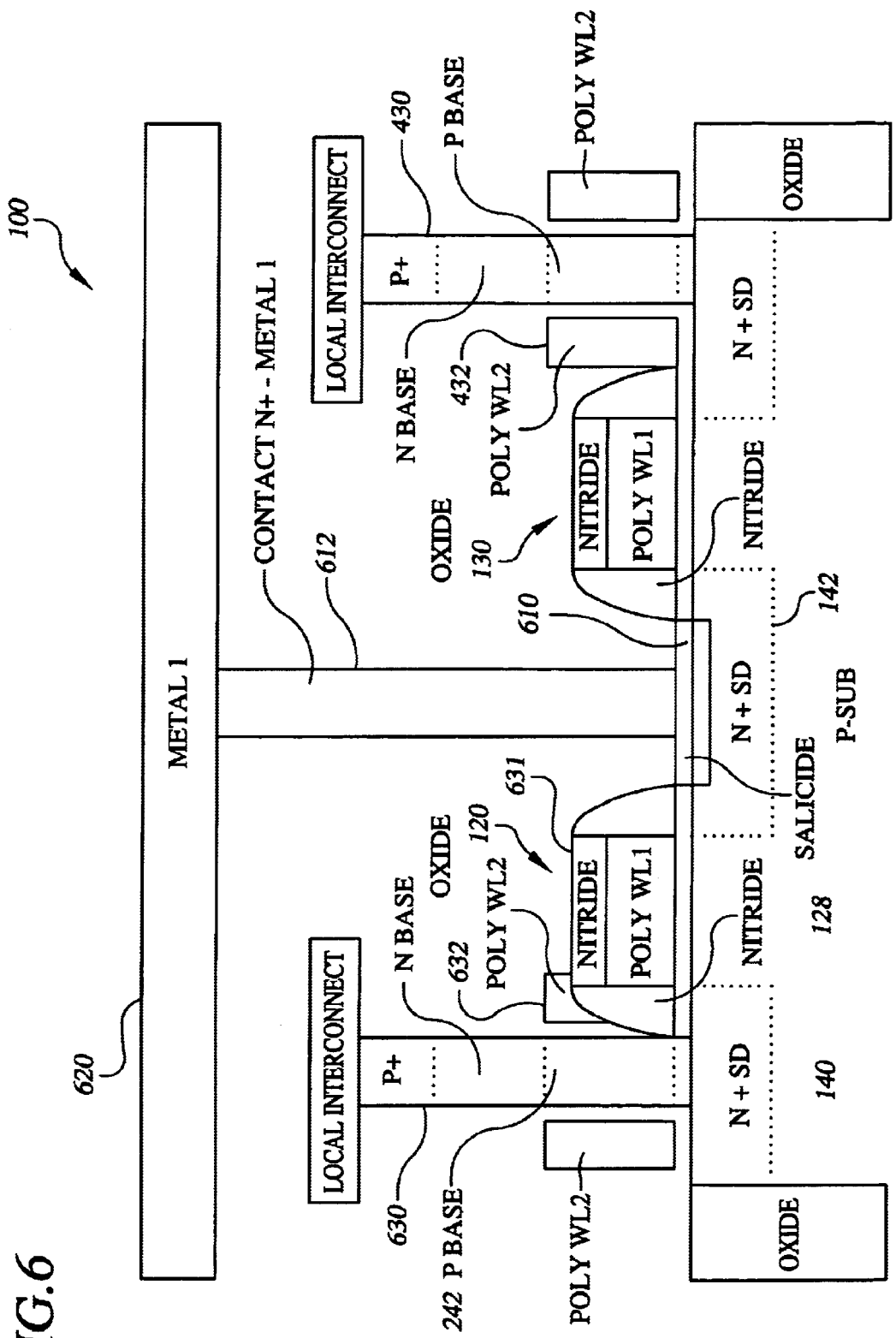
FIG. 6 shows a thyristor-based semiconductor device, such as the device shown in FIG. 5, having a contact from a source/drain region to a metal layer, according to another example embodiment of the present invention.

In another example embodiment of the present invention, a contact from a metal layer in the device (e.g., such as a metal layer commonly referred to as metal 1) to the source/drain region 142 is made as shown in FIG. 6. After the local interconnects are formed, an opening in the oxide is etched to expose a region over the source/drain region 142. A contact to substrate (which may have a salicide) 610 is then formed over the source/drain region 142, and a conductor 612 is deposited in the opening and extending from the device through the oxide. The conductor 612 may, for example, include typical interconnect materials, such as metal, doped polysilicon or other conductive materials. A metal interconnect layer 620 is then formed coupled to the contact 612 and makes electrical contact between the source/drain region 142 and other circuitry in the device and/or external contacts.

This particular approach has a hard mask (e.g., nitride) both on top of and on the sides of the poly gate material 128. With the hard mask around the poly gate material 128, the structure can tolerate some misalignment in the photolithographic process, which allows for a smaller cell. For example, if the thyristor pillars are misaligned as thyristor body 630 in FIG. 6 is (e.g., closer to the MOSFET 121 than thyristor body 420 in FIG. 4 is), a portion of thyristor control port 632 overlaps gate 120. In this instance, the hard mask prevents the thyristor control port 632 from shorting to the gate 120.

In one implementation, as generally described in the above-mentioned U.S. Patent, typical operation of the device 100 involves using an array-access controller to provide appropriate control over bit line and word line connections to the device 100. Bit line contact is made to the N+ source/drain region 142 via contact 612 with the metal interconnect layer 620 implemented as a bit line. Word line contact is made with a first word line (WL1) including the gate 120 and a second word line (WL2) including the thyristor control port 632. In standby mode, for example, the word lines and the bit line 620 are inactive or at their low voltage levels (which can be different for each line). For a write "Zero" operation, the bit line 620 is raised to its high level and WL1 (gate 120) becomes active. This charges the level at the N+ source/drain region 140 (also an emitter region of the thyristor body 630) to a high voltage level and moves the thyristor body 630 out of the strong forward biased region. A pulse is then applied to WL2 (control port 632). Capacitive coupling from control port 632 to the adjacent body region of the thyristor body 630, e.g., where the adjacent body region is the middle P-doped region 242 of the PNPN thyristor, results in an outflow of the minority charges from the middle P-doped region 242 on the falling edge of the WL2 pulse and blocks the current pass. The thyristor body 630 is sufficiently thin so that the control port 632 has tight control on the potential of the body region 630, and can modulate this potential by the capacitive coupling. The thyristor body 630 is switched to the blocking state after this operation.

For a write "One" operation, the voltage level of bit line 620 is held low. After WL1 (gate 120) is raised to its high level, a pulse is applied to WL2 (control port 632). The rising edge of this pulse raises the potential of the P base region 242 by capacitive coupling and makes the NP and lower PN junctions forward biased which, in-turn, starts the well-known regenerative process in the PNPN thyristor construction and the thyristor body 630 transitions to its forward conducting state. After completing such an operation, control over the bit line and word lines typically changes to effect the standby mode in which a current path through the MOSFET 121 is blocked.

Figure 7:
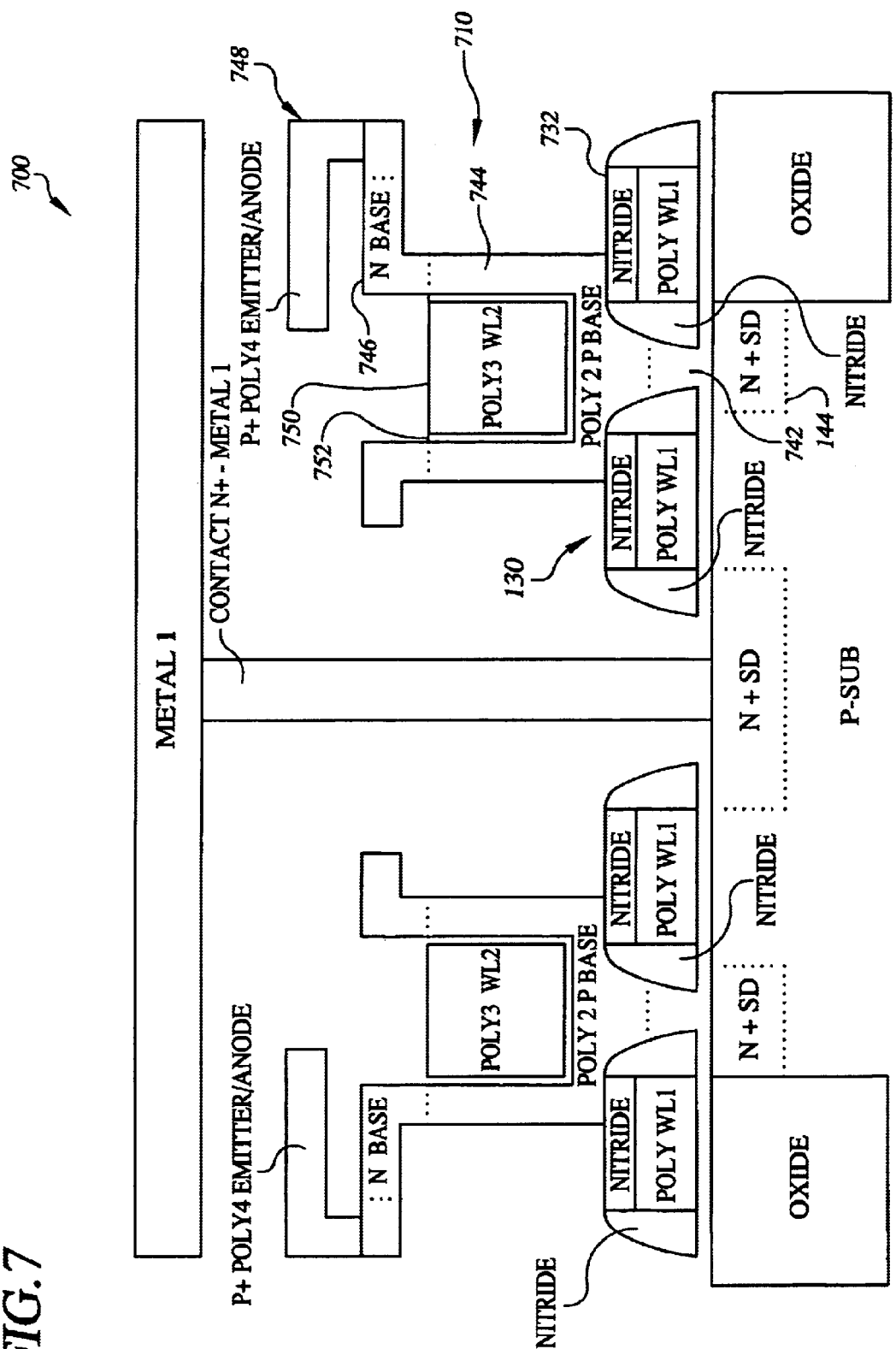
FIG. 7 shows a thyristor-based semiconductor device having horizontal and vertical thyristor portions, according to another example embodiment of the present invention.

As discussed above, the arrangement of the thyristor device over the substrate can be made in a variety of manners, depending upon the application. FIG. 7 shows another example embodiment of the present invention, wherein semiconductor device 700 is shown manufactured having a thyristor device 710 formed over a substrate having source/drain region 144 formed therein, and gates 130 and 732 formed thereon. The substrate, source/drain regions and the gates are formed, for example, as discussed in connection with FIG. 1. The thyristor in FIG. 7 is formed using the source/drain region 144 as a portion of an emitter region. An additional portion 742 of material is deposited between gates 130 and 732 and doped to N+ polarity (e.g., via out diffusion from the N+ S/D region 144) to form an N+ emitter region. A P base material 744 is then formed extending over and up from the N+ emitter region 742 and the gates 130 and 732, as shown. N base material 746 and a P+ emitter material 748 are subsequently formed as shown. The formation of the thyristor body portions 742, 744, 746 and 748 is accomplished using deposition and etch back steps, such as discussed in connection with the example embodiments discussed hereinabove.

The formation of a control port for the thyristor body can be effected either after the formation of the entire thyristor body, or, for example, after the formation of the P base 744. A dielectric material 752 is formed around the P base 744. A polysilicon control port 750 is deposited in an opening defined by the dielectric material 752. In addition, the formation of the P+ emitter region 748 can be effected in a variety of manners, including using a typical deposition process that forms P+ polysilicon or implanting P+ material into a portion of the thyristor.

The formation of the P base 744 and control port 750 can be effected in a variety of manners. In one implementation (not shown), prior to the formation of the P base region 744, an oxide is deposited over the gates and substrate and etched to form an opening. A thin layer of the thyristor body material is conformably deposited and selectively etched with a photolithographic and etch step (P base region 744). P base region 744 may be formed, for example, by depositing amorphous polysilicon and recrystallizing it. The thyristor body material is implanted to form the P base 744, a dielectric 752 is formed on the thyristor body (region 744) and control port material 750 is deposited and selectively etched back. The N base region 746 is formed by ion implantation (in this implementation the N base 746 doping is significantly higher than the doping of the P base 744). The P+ anode 748 is formed either by selective ion implantation of region 744 or deposition of a dielectric material, selective etching of the dielectric material and deposition of a P+ polysilicon (region 748).

Figure 8A:
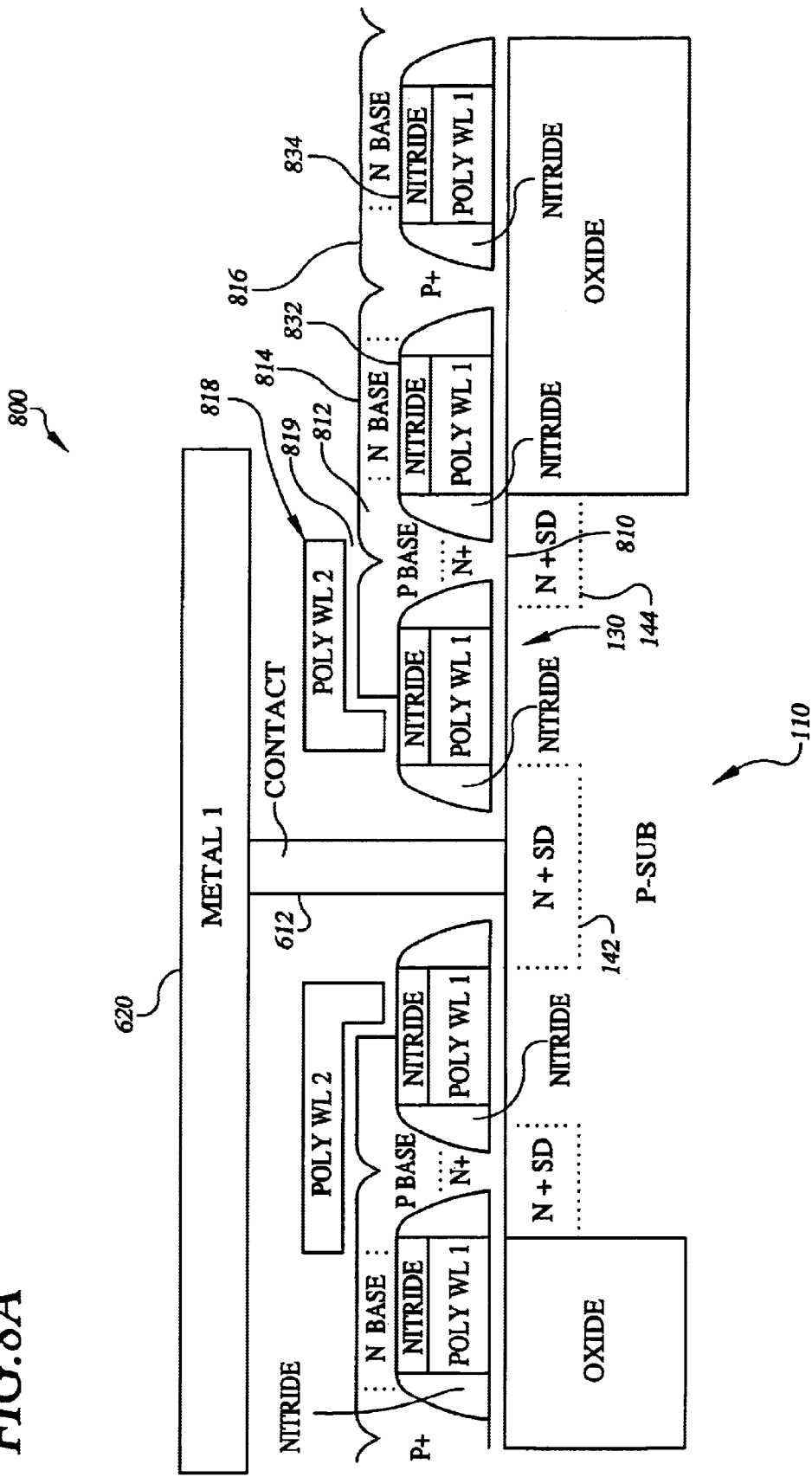
FIG. 8A shows a thyristor-based semiconductor device having a horizontally-oriented thyristor portion over a transistor gate, according to another example embodiment of the present invention.

FIG. 8A shows another example embodiment of the present invention, wherein a transistor is formed in a semiconductor device 800 that includes source/drain regions 142 and 144 formed in a substrate, a gate 130 formed over the substrate and a thyristor having a horizontally-oriented portion over the gate 130. The device 800 is formed having a thyristor that uses a self-aligned N base process. A portion of a source/drain region in the substrate is used as an emitter 810 of the thyristor. Semiconductor material is then deposited over the gate portions to be implanted and used to make the thyristor. Each of the following implantation steps may be effected in a variety of manners, such as via conventional masking and implanting processes. P base material 812 is implanted, and a poly gate 818 is then formed over the thyristor body material, with an intervening gate dielectric material 819. Using the poly gate 818 as a mask, N base material 814 is implanted over the hard mask of gate 832. In one implementation, the N base 814 has significantly higher implant dose than the P base 812 so the P base can be counter doped to form N base material. P+ emitter material 816 is selectively implanted between and over a portion of a hard mask of gates 832 and 834. The N+ emitter 810, P base 812, N base 814 and P+ emitter 816 form the body of a thyristor, and the poly gate 818 is used as a control port via the P base material 812. This particular approach is particularly advantageous because the N base 814 is self-aligned to the gate 818, and further because the P base capacitance area is increased due to its extension over the gate 820. For more information regarding increasing the capacitive coupling via the base portion of the thyristor, reference may be made to U.S. patent application Ser. No. 10/023,060, now U.S. Pat. No. 6,583,452, filed Dec. 17, 2001 and entitled "Thyristor-based Device Having Extended Capacitive Coupling."

Figure 8B:
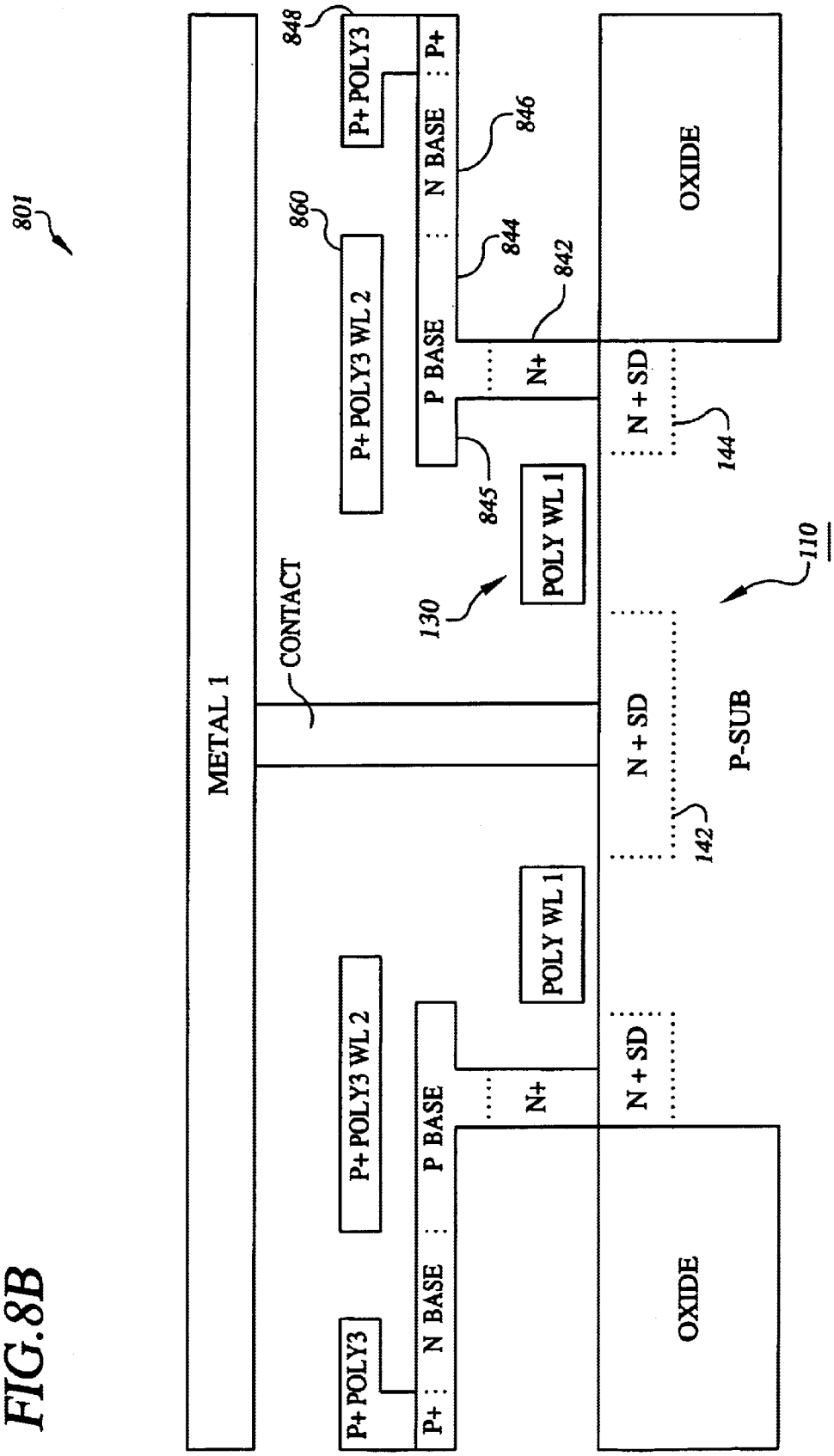
FIG. 8B shows another thyristor-based semiconductor device having a horizontally-oriented thyristor portion over a transistor gate, according to another example embodiment of the present invention.

FIG. 8B is another thyristor-based semiconductor device 801 having a horizontally-oriented portion of the thyristor over a gate, according to another example embodiment of the present invention. Similar to FIG. 8A, the device 801 has a transistor with source/drain regions 142 and 144 in a substrate and a gate 130 over the substrate and above the source/drain regions. The thyristor includes a vertical N+ emitter region 842, horizontally oriented P base region 844, N base region 846 and P+ emitter region 848. A thyristor gate 860 is formed over and capacitively coupled to the P base region 860. In one implementation, the gate is deposited over the P base region prior to the formation of the N base region and is used to self-align the N base region to the gate. The portion 845 of the P base that extends over the gate 130 increases the capacitive coupling of the P base to the gate.

Figure 9:
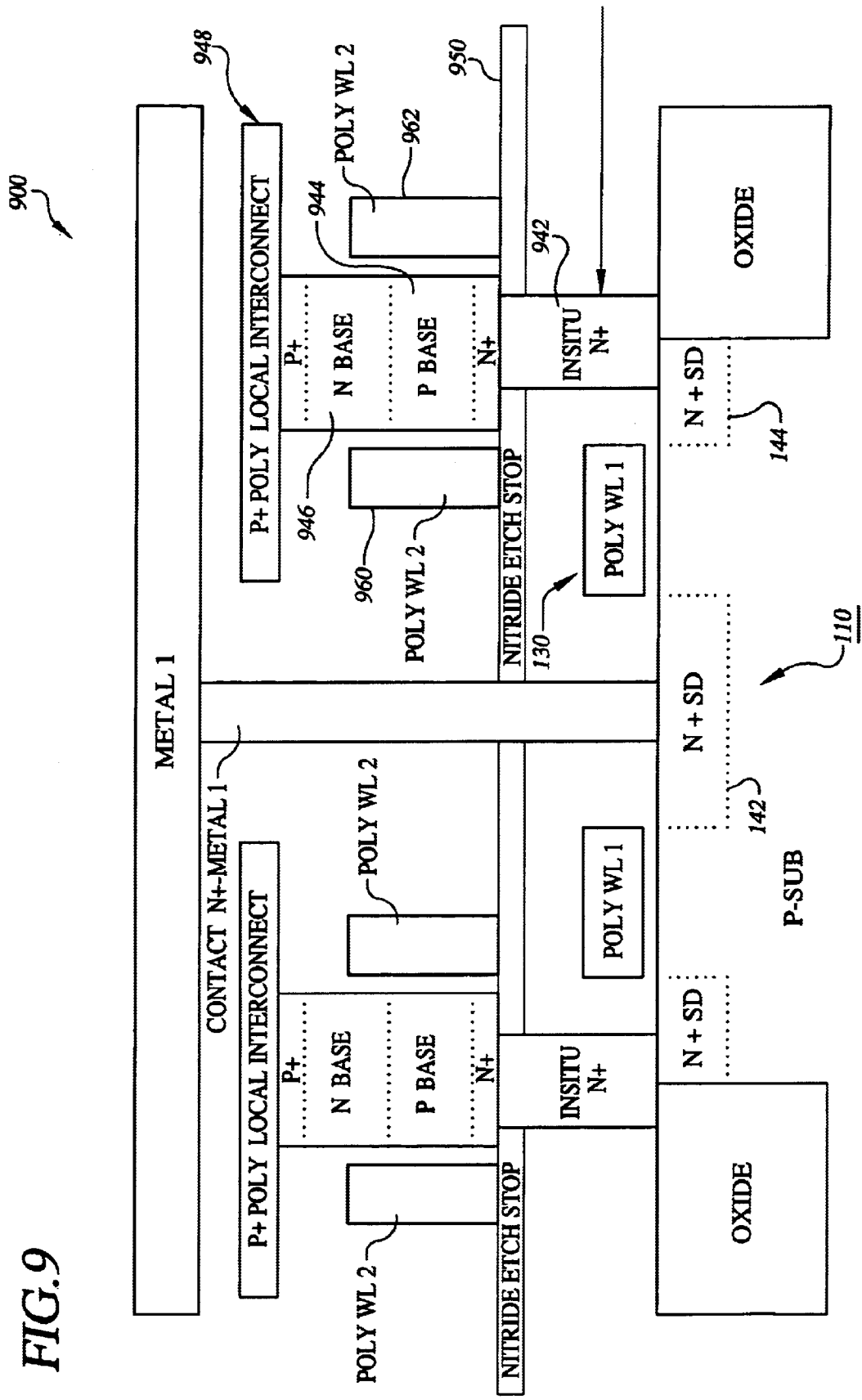
FIG. 9 shows a thyristor-based semiconductor device having an etch stop embedded in dielectric material over a transistor gate, according to another example embodiment of the present invention.

FIG. 9 shows another thyristor-based semiconductor device 900 that can be formed, for example, using five polysilicon depositions and an etch stop embedded in a dielectric material above a MOSFET gate poly (region 130), according to another example embodiment of the present invention. The device 900 includes a transistor having source/drain regions 142 and 144 and gate 130 formed using a first polysilicon deposition. The source/drain region 144 is used as a portion of an N+ emitter of a thyristor device. Oxide 915 is deposited over the substrate 110, the source/drain regions 142 and 144 and the gate 130, and a nitride etch stop 950 is formed over the oxide. The nitride etch stop 950 and oxide 915 are selectively etched to form an opening and N+ polysilicon (region 942) is deposited in the opening and planarized (e.g., using CMP or etch back) to form the N+ cathode. Additional oxide is deposited, an opening is formed therein, polysilicon is formed in the opening and doped to form P base 944 and N base 946 during a third polysilicon deposition and the polysilicon is etched back. In one implementation, amorphous polysilicon is used for regions 942, 944 and 946 and is recrystallized. In another implementation, the N base (946) and P base (944) regions are formed with ion implants. The oxide above the nitride etch stop is removed and a gate dielectric material is formed on regions 946 and 944 of the thyristor body. A fourth polysilicon deposition is used to deposit material to form poly gate portions 960 and 962 and additional oxide is deposited over the poly gate portions. A fifth polysilicon deposition is doped to be P+ either in situ or with a P+ implant to form P+ emitter/local interconnect 948. This particular example embodiment is advantageous because it makes possible greater separation between the gate 960 and gate 130, reducing the capacitive coupling between them.

Figure 10:
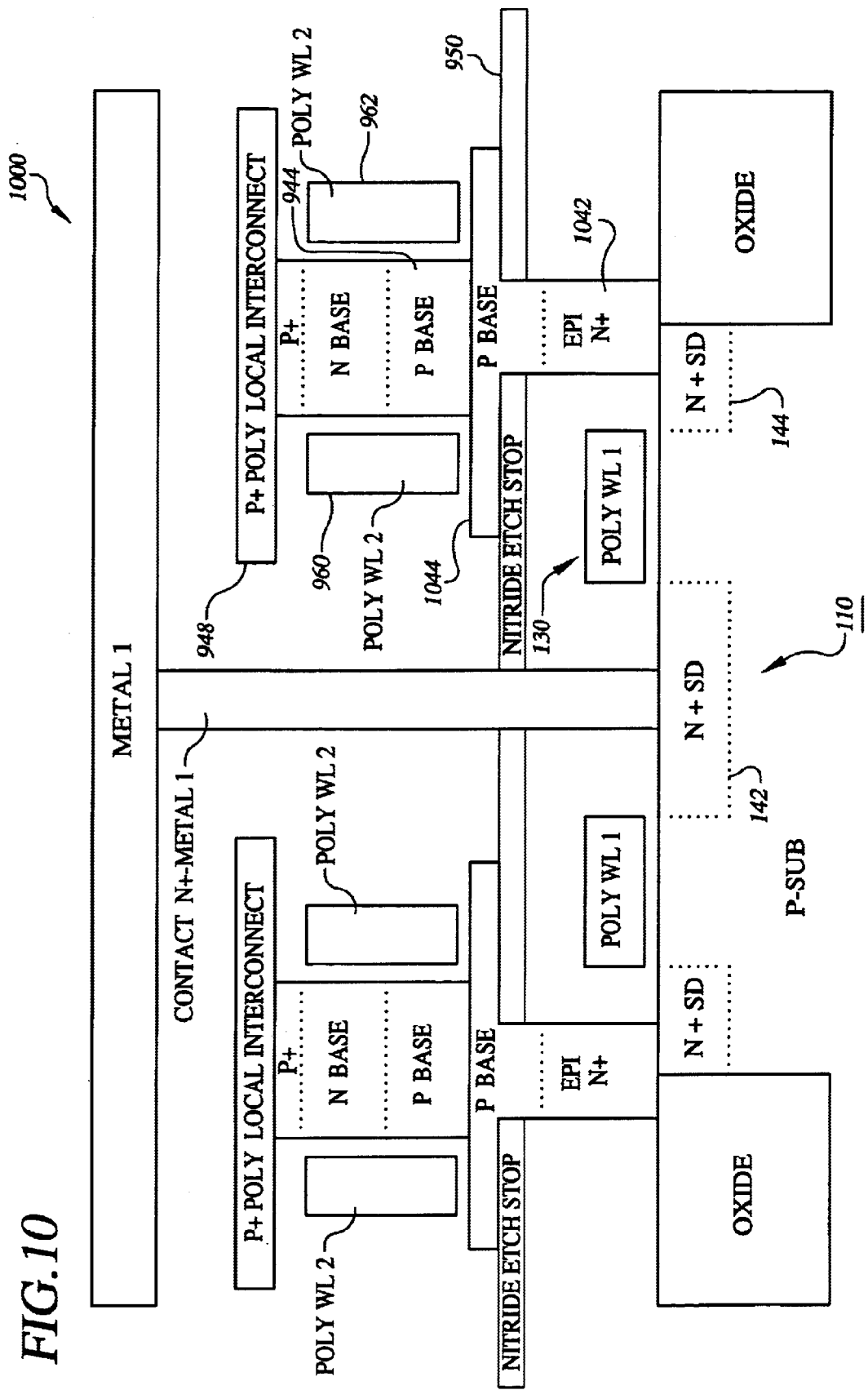
FIG. 10 shows another thyristor-based semiconductor device having an etch stop embedded in dielectric material over a transistor gate, according to another example embodiment of the present invention.

FIG. 10 is another thyristor-based semiconductor device 1000 having an etch stop 950 embedded in the dielectric material above a gate polysilicon (region 130), according to another example embodiment of the present invention. In this implementation, a portion 1042 of the N+ emitter region above the substrate 110 is formed using an episilicon growth and subsequent N+ doping. The P base region is formed over the N+ emitter and having a first portion 1044 extending laterally over the etch stop 950 using, for example, selective episilicon growth. The extended portion reduces the accuracy needed to subsequently form portions of the thyristor extending over the P base region (e.g., P base 944), and reduces the chance of misalignment of the vertical thyristor portions.

Figure 11A:
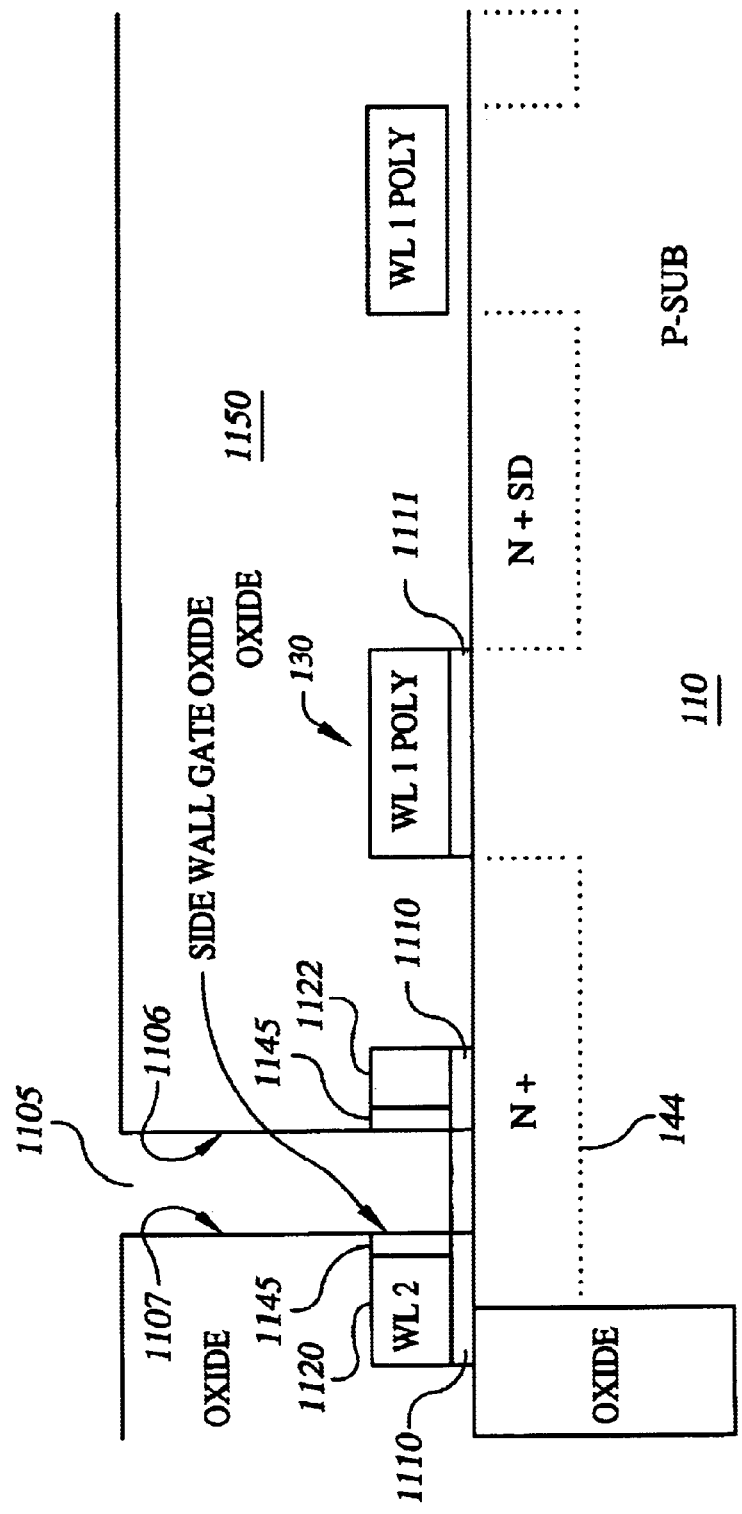
FIG. 11A shows a thyristor-based semiconductor device undergoing manufacture, according to another example embodiment of the present invention.
Figure 11B:
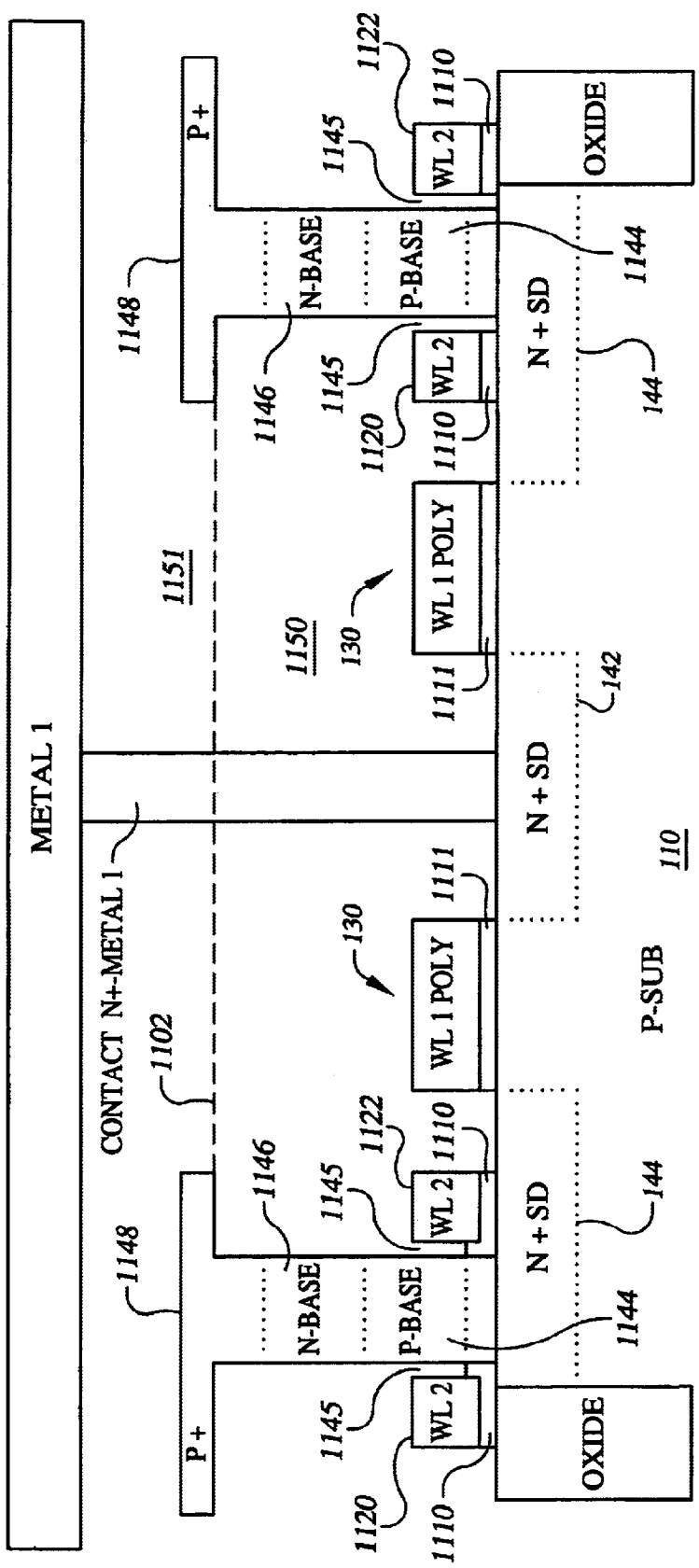
FIG. 11B shows a thyristor-based semiconductor device undergoing manufacture, according to another example embodiment of the present invention.

FIGS. 11A and 11B show a thyristor-based semiconductor device that can be manufactured using, for example, a single polysilicon deposition process to form both the transistor gate 130 and sidewall thyristor gates 1120 and 1122, according to another example embodiment of the present invention. In FIG. 11A, gates 1120, 1122 and 130 are formed using a single deposition process and an oxide 1150 is formed over the substrate 110 and gates. An opening 1105 having sidewalls 1106 and 1107 is etched in the oxide 1150 where a vertical portion of the thyristor is to be formed. Side wall gate dielectric 1145 is formed at the sidewalls in the opening and adjacent the gatesl 120, 1122 and 130, and any dielectric formed at the bottom of the opening is anisotropically etched to expose the N+ region 144. In a more particular implementation, the part of the N+ region 144 that is under the thyristor is implanted through the opening 1105. In another more particular implementation, the polysilicon gates 1120 and 1122 are etched to recess them from the openings, prior to the formation of the gate oxide.

In one implementation, a thick gate dielectric material 1110 is formed on the substrate 110 prior to formation of the gates 1120, 1122 and 130 for use in high voltage applications (e.g., wherein a high voltage is to be applied to one or more of the gates). A portion of the dielectric material 1110 to be used under the transistor gate 130 is selectively etched with a relatively thinner dielectric material 1111 subsequently being formed. The resulting dielectric material 1110 includes a relatively thick gate dielectric material under the gates 1120 and 1122, and a relatively thin gate dielectric material under the gate 130. This approach has been found to be particularly advantageous in high voltage applications.

In FIG. 11B, the opening is filled with amorphous polysilicon that is also formed extending laterally over the oxide (region 1148), and the polysilicon is recrystallized (shown here as part of two repeated and similarly numbered thyristor structures). For clarity, dashed line 1102 represents the upper portion of the oxide as deposited in FIG. 11A. P base 1144, N base 1146 and P+ emitter 1148 regions are then implanted into the recrystallized polysilicon. The P+ emitter region is selectively etched to form the thyristor structures shown. Additional oxide 1151 is deposited over the oxide 1150 and over the P+ emitter regions 1148, and contacts and interconnects can then be formed therein and thereon, as described in example embodiments above. The thyristor pillar structure exhibits strength due to the oxide adjacent the pillar not necessarily being etched.

Figure 12:
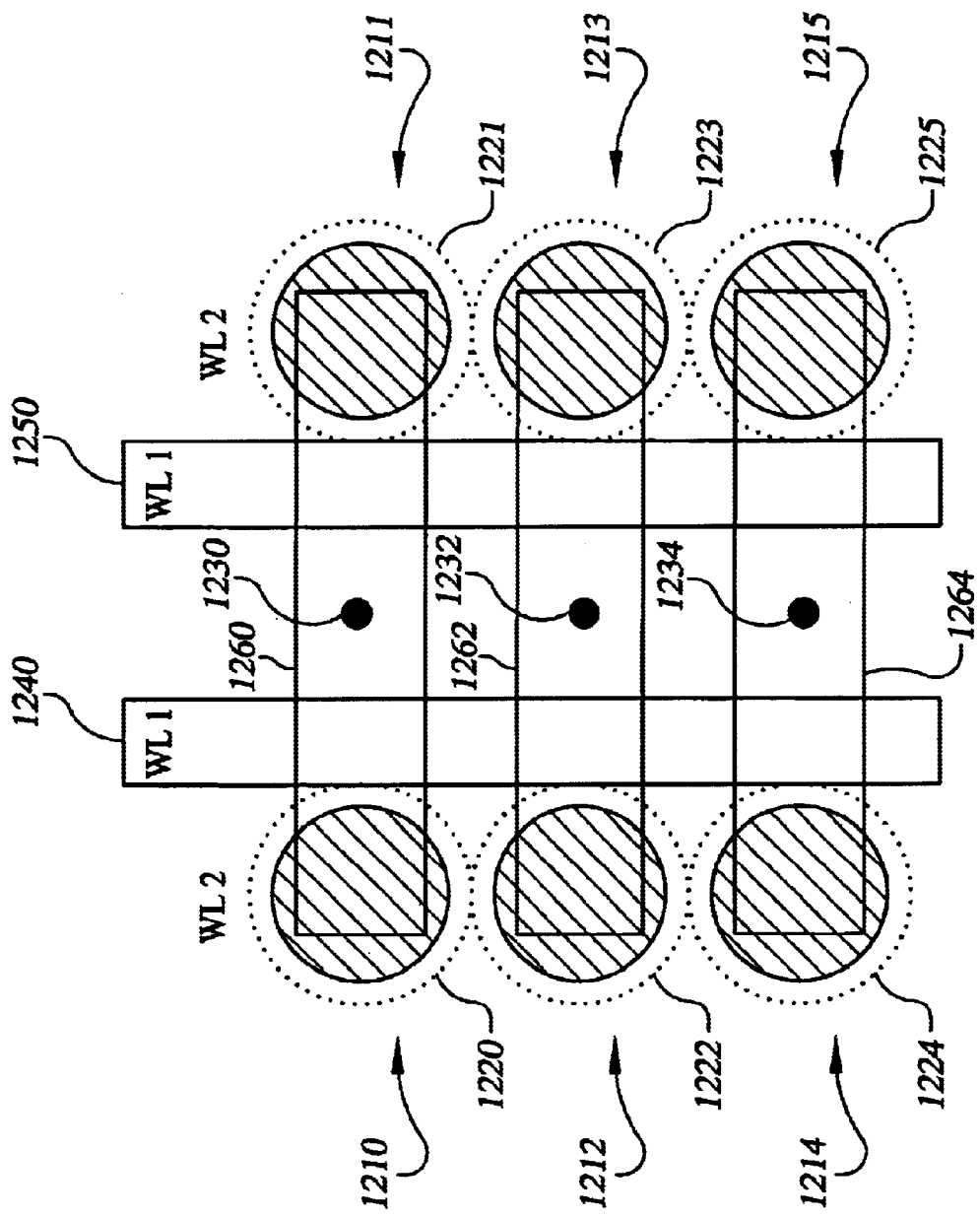
FIG. 12 shows a top-down view of an array of memory cells employing thyristor-based semiconductor devices, such as those described hereinabove, according to another example embodiment of the present invention.

FIG. 12 is a top-down view of a memory cell employing thyristor-based memory cells, such as those described hereinabove, according to another example embodiment of the present invention. Vertical thyristors 1210–1215 are formed having poly gates 1220–1225 formed around each pillar and acting as word line 2 (WL2) contacts. The memory cell includes transistor gates 1240 and 1250 that act as word line 1 (WL1) contacts. The gates are formed over diffusion regions 1260, 1262 and 1264, in which source/drain regions are formed. As described hereinabove, the source/drain regions may be used as a portion of a thyristor, such as an N+ emitter region. Bit line contacts 1230, 1232 and 1234 are formed to the diffusion regions, and relate, for example, to contacts such as the contact 612 shown in FIG. 6. In addition, various other arrangements of the gates, thyristors, diffusion regions and bit line contacts are applicable to the present invention.

The thyristor-based devices described hereinabove can be implemented in a variety of manners and used in a variety of applications. In one implementation, the thyristor based device is coupled to circuitry adapted to form one or more commonly-known circuits, such as an electronic latch, a power thyristor, an output driver, a power management device and an electrostatic discharge device adapted to latch and shunt power from circuitry coupled to the thyristor-based device.

In example embodiments discussed hereinabove, the thyristor body semiconductor material has been deposited into an opening in a dielectric. In a more particular example embodiment of the present invention, the thyristor body semiconductor material is deposited after formation of the transistors and selectively etched, leaving a pillar. The pillar is then implanted to form one or more body portions of the thyristor. In one implementation, an etch stop is formed over the transistors, prior to depositing the thyristor body material. The material is then deposited over the transistors and selectively etched to form the pillar.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors; adding structures to the integrated circuit device; increasing the number of PN sections in the thyristor-based memory device; and interchanging P and N regions in the device structures and/or using PMOSFETS rather than NMOSFETS. In addition, for more information regarding implementations to which the present invention is applicable, reference may be made to the above-mentioned U.S. Patent entitled "Semiconductor Capacitively-Coupled NDR Device And Its Applications In High-Density High-Speed Memories And In Power Switches." Such modifications and changes do not depart from the true spirit and scope of the present invention that is set forth in the following claims.

What is claimed is:

1. A thyristor-based semiconductor device comprising:

a semiconductor substrate having an upper surface;

a transistor having a gate over the upper surface and first and second source/drain regions having a portion thereof in the substrate and below the upper surface; and a thyristor extending over the upper surface and having a body with first and second emitter regions separated by first and second base regions respectively adjacent to the first and second emitter regions and a portion of the thyristor extending over the gate, the first emitter region being electrically coupled in series with the first source/drain region, and a control port adapted for capacitively coupling to the body for facilitating control of current flow therein.

2. The thyristor-based semiconductor device of claim 1, wherein the thyristor is a thin capacitively-coupled thyristor.

3. The thyristor-based semiconductor device of claim 1, wherein the first emitter region and the first source/drain region are the same region.

4. A thyristor-based semiconductor device comprising:

a semiconductor substrate having an upper surface;

a transistor having a gate over the upper surface and first and second source/drain regions having a portion thereof in the substrate and below the upper surface; and a thyristor extending over the upper surface and having a body with first and second emitter regions separated by first and second base regions respectively adjacent to the first and second emitter regions wherein at least a portion of the thyristor body is disposed in a trench having sidewalls in a layer over the transistor, the first emitter region being electrically coupled in series with the first source/drain region, and a control port adapted for capacitively coupling to the body for facilitating control of current flow therein.

5. The thyristor-based semiconductor device of claim 4, wherein the layer over the transistor comprises dielectric material.

6. The thyristor-based semiconductor device of claim 4, wherein the sidewalls comprise etched portions of the layer over the transistor.

7. The thyristor-based semiconductor device of claim 1, wherein the control port is disposed laterally adjacent to the thyristor body.

8. The thyristor-based semiconductor device of claim 7, wherein the control port is disposed laterally around a portion of the thyristor body.

9. The thyristor-based semiconductor device of claim 1, wherein the control port is adapted to capacitively couple a signal to the first base region.

10. The thyristor-based semiconductor device of claim 1, wherein the control port is adapted to switch the thyristor body between current-blocking and current-passing states.

11. The thyristor-based semiconductor device of claim 1, wherein the second source/drain region is coupled to a bit line and wherein the second emitter region is coupled to a reference voltage line.

12. The thyristor-based semiconductor device of claim 11, wherein the first emitter region is adapted for storing data.

13. The thyristor-based semiconductor device of claim 12, wherein the thyristor-based semiconductor device is configured and arranged for storing, retrieving and erasing data at the first emitter region in response to signals applied to at least one of: the control port, the gate, the reference voltage line and the bit line.

14. The thyristor-based semiconductor device of claim 1, wherein the thyristor is adapted to operate as part of a power thyristor.

15. The thyristor-based semiconductor device of claim 1, wherein the thyristor is adapted to operate as part of an output driver.

16. The thyristor-based semiconductor device of claim 1, wherein the thyristor is adapted to operate as part of a power management device.

17. The thyristor-based semiconductor device of claim 1, wherein the thyristor is adapted to operate as part of an electrostatic discharge circuit adapted to latch and shunt power from circuitry coupled to the thyristor.

18. The thyristor-based semiconductor device of claim 1, wherein the transistor gate is adapted to apply a voltage to the thyristor as a back gate.

19. The thyristor-based semiconductor device of claim 1, wherein the first base region has two vertical portions and wherein the control port is disposed laterally between the two vertical portions.

20. The thyristor-based semiconductor device of claim 1, further comprising a dielectric material over the transistor gate, the dielectric material being adapted to reduce parasitic capacitance between the thyristor control port and the transistor gate.

21. The thyristor-based semiconductor device of claim 20, further comprising a nitride etch stop over the transistor gate.

22. The thyristor-based semiconductor device of claim 21, at least one of the first and second base regions of the thyristor extends over the first emitter region and laterally over the nitride etch stop.

23. The thyristor-based semiconductor device of claim 1, further comprising a hard mask over the transistor gate, the hard mask being adapted to electrically insulate the transistor gate from the thyristor.

24. The thyristor-based semiconductor device of claim 1, further comprising an insulative material over the transistor gate and an etch stop over the insulative material, the etch stop being adapted to reduce capacitive coupling between the thyristor control port and the transistor gate.

25. The thyristor-based semiconductor device of claim 1, wherein the control port is adapted to capacitively couple a signal to the thyristor to control current passing through the thyristor independently from any MOS inversion channel formation against a portion of the thyristor to which the control port is capacitively coupled.

26. The thyristor-based semiconductor device of claim 1, further comprising a first insulative material between the transistor gate and the upper surface and a second insulative material between the thyristor control port and the upper surface, the second insulative material being thicker than the first insulative material.

27. A method of using the thyristor-based semiconductor device of claim 1, the method comprising: controlling the gate and the control port for storing, retrieving and manipulating data at the first emitter region.

28. The method of claim 27, wherein controlling the gate and the control port for storing, retrieving and manipulating data at the first emitter region includes controlling a bit line coupled to the second source/drain region and controlling a reference voltage line coupled to the second emitter region for storing, retrieving and manipulating data at the first emitter region.

* * * * *

UNITED STATES PATENT AND TRADEMARK OFFICE
CERTIFICATE OF CORRECTION

PATENT NO. : 6,690,038 B1
DATED : February 10, 2004
INVENTOR(S) : Cho et al.

It is certified that error appears in the above-identified patent and that said Letters Patent is hereby corrected as shown below:

<u>Title page,</u>
Item [62], Related U.S. Application Data, should read as follows:
-- Division of application No. 10/023,052, filed on Dec. 17, 2001, now U.S. Patent 6,653,174. --

<u>Column 1,</u>
Lines 5-10, delete lines in its entirety and replace with:
-- This is a divisional of patent application No. 10/023,052, now U.S. Pat. No. 6,653,174, filed on Dec, 17, 2001, to which priority is claimed under 35 U.S.C. § 120. --

<u>Column 11,</u>
Line 17, "gatesl 120" should read -- gates 1120 --.

Signed and Sealed this

Ninth Day of November, 2004

JON W. DUDAS
*Director of the United States Patent and Trademark Office*